(12) United States Patent
Shimoyama (10) Patent No.: US 12,439,683 B2
(45) Date of Patent: Oct. 7, 2025

(54) SEMICONDUCTOR DEVICE

(71) Applicant: RENESAS ELECTRONICS CORPORATION, Tokyo (JP)

(72) Inventor: Hiroya Shimoyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 434 days.

(21) Appl. No.: 18/170,153

(22) Filed: Feb. 16, 2023

(65) Prior Publication Data

US 2023/0326922 A1     Oct. 12, 2023

(30) Foreign Application Priority Data

Apr. 11, 2022   (JP) .................. 2022-065056

(51) Int. Cl.
| | | |
|---|---|---|
| *H10D 84/00* | (2025.01) | |
| *H10D 64/27* | (2025.01) | |
| *H10D 84/80* | (2025.01) | |
| *H10D 89/00* | (2025.01) | |
| H10D 89/60 | (2025.01) | |

(52) U.S. Cl.
CPC ......... *H10D 84/811* (2025.01); *H10D 64/513* (2025.01); *H10D 89/611* (2025.01)

(58) Field of Classification Search
CPC .. H10D 64/513; H10D 84/811; H10D 89/611; H10D 30/00; H10D 62/00; H10D 62/60; H10D 89/00; H10D 84/00; H10D 64/00; H10D 64/111
USPC ........................................... 257/368
See application file for complete search history.

(56) References Cited

U.S. PATENT DOCUMENTS

| | | | |
|---|---|---|---|
| 6,605,842 B2 * | 8/2003 | Hoshino | ............... H10D 84/83 257/376 |
| 8,633,550 B2 | 1/2014 | Uno et al. | |
| 2024/0178316 A1 * | 5/2024 | Nasu | ................ H10D 30/0297 |

FOREIGN PATENT DOCUMENTS

| | | |
|---|---|---|
| JP | 2013-012669 A | 1/2013 |
| JP | 2020-092176 A | 6/2020 |

* cited by examiner

*Primary Examiner* — Monica D Harrison
(74) *Attorney, Agent, or Firm* — Rimon P.C.

(57) ABSTRACT

A sense MOSFET is formed at a position surrounded by a main MOSFET and a source pad connected to a source region of the main MOSFET in plan view. A source potential is supplied to a source region of the sense MOSFET via a wiring surrounded by the source pad in plan view, a field plate electrode formed in a trench together with a gate electrode, and wirings formed outside the source pad.

10 Claims, 12 Drawing Sheets

SEMICONDUCTOR DEVICE

CROSS-REFERENCE TO RELATED APPLICATIONS

The disclosure of Japanese Patent Application No. 2022-065056 filed on Apr. 11, 2022 including the specification, drawings and abstract is incorporated herein by reference in its entirety.

BACKGROUND

The present invention relates to a semiconductor device, and relates to, for example, a technique effectively applied to a semiconductor device including a main MOSFET and a small-scale MOSFET for current detection.

In a power MOSFET that is required to have a high withstand voltage, highly accurate monitoring of a current value flowing through an element is sometimes required for the purpose of monitoring or controlling the internal state. As a structure for measuring the current value of a main MOSFET mounted on a semiconductor chip, mounting a small-scale sense MOSFET for current detection on a semiconductor chip (hereinafter, simply referred to as chip in some cases) has been known.

There are disclosed techniques listed below.

[Patent Document 1] Japanese Unexamined Patent Application Publication No. 2013-12669

[Patent Document 2] Japanese Unexamined Patent Application Publication No. 2020-92176

Also, Patent Document 1 (Japanese Unexamined Patent Application Publication No. 2013-12669) describes a structure in which a sense MOSFET is arranged at the center of a chip and a source electrode of the sense MOSFET is led out by a wiring formed on a surface of the chip.

Further, Patent Document 2 (Japanese Unexamined Patent Application Publication No. 2020-92176) describes a structure in which a sense MOSFET is arranged at the center of a chip and a source electrode of the sense MOSFET is routed inside a package having a multilayer wiring to be electrically taken out to the outside.

SUMMARY

Since a die bond crack progresses from an outer periphery of a chip in a reliability test in which a heat load is applied to the semiconductor chip, there is a fear that the crack extends to just below the sense MOSFET and the current sense ratio (hereinafter, simply referred to as sense ratio in some cases) will fluctuate greatly if the sense MOSFET is formed near the outer periphery of the chip. Therefore, it is desirable to arrange the sense MOSFET in the central portion of the chip.

Thus, it is conceivable that the sense MOSFET is arranged in the central portion of the chip and a source pad of the sense MOSFET is led out to a position different from a source pad of a main MOSFET by using a multilayer wiring on a semiconductor substrate. However, in this case, it is necessary to increase the manufacturing process of the semiconductor device and the number of masks for patterning, resulting in the increase in the manufacturing cost of the semiconductor device.

Also, in Patent Document 1, since the source pad (surface electrode, source electrode) of the main MOSFET is divided in a lead-out region of the sense MOSFET, the shape of the source pad of the main MOSFET becomes distorted and the area of the source pad is reduced. Consequently, there are problems such as deterioration of the chip performance of the main MOSFET and restriction on the bonding layout.

Further, in Patent Document 2, the above-mentioned problems related to the shape and area of the source electrode of the main MOSFET are improved. However, since it is necessary to use a multilayer wiring board, there is a problem of the increase in package-related manufacturing and material costs. Moreover, there is a problem of the increase in the size of the semiconductor device due to the use of the multilayer wiring board.

The other problems and novel features will become apparent from the description of this specification and accompanying drawings.

An outline of a typical embodiment disclosed in this application will be briefly described as follows.

In a semiconductor device according to an embodiment, a sense MOSFET is formed at a position surrounded by a main MOSFET and a source pad connected to a source region of the main MOSFET in plan view. Here, a source potential is supplied to a source region of the sense MOSFET via a wiring surrounded by the source pad in plan view, a field plate electrode formed together with a gate electrode in a trench, and a wiring formed outside the source pad.

According to the embodiment, it is possible to improve the performance of the semiconductor device.

DETAILED DESCRIPTION

In the description below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference signs throughout the drawings for describing the embodiments, and the repetitive description thereof will be omitted. In addition, the description of the same or similar portions is not repeated in principle unless particularly required in the following embodiments.

In each plan view (planar layout) used in the following description, contact plugs are hatched in order to make the drawings easier to understand.

Here, a power MOSFET (Metal Oxide Semiconductor Field Effect Transistor, MOS field effect transistor) will be described as an example of the semiconductor device of this application. A power MOSFET is a semiconductor device capable of handling the power of several watts or more. The semiconductor device of this application includes a trench gate power MOSFET among power MOSFETs. The trench gate power MOSFET has a gate electrode made of polysilicon or the like in a trench (relatively long and thin groove) formed in an upper surface (first main surface) of a semiconductor substrate, and has a channel in a thickness direction of the semiconductor substrate. In this case, normally, an upper surface side of the semiconductor substrate serves as a source and a lower surface (back surface, second main surface) side serves as a drain.

Further, the semiconductor device of this application includes a trench double-gate power MOSFET among trench gate power MOSFETs. The trench double-gate power MOSFET has a field plate electrode below the gate electrode (intrinsic gate electrode) in the trench. The field plate electrode has a function of keeping an electric field constant by dispersing a steep potential gradient concentrated near a drain-side end of the gate electrode, and is electrically connected to the source electrode. By keeping the electric field near the field plate electrode constant, the withstand voltage of the device can be ensured.

First Embodiment

<Structure of Semiconductor Device>

Hereinafter, a semiconductor device according to the present embodiment will be described with reference to FIG. 1 to FIG. 6.

Figure 1:
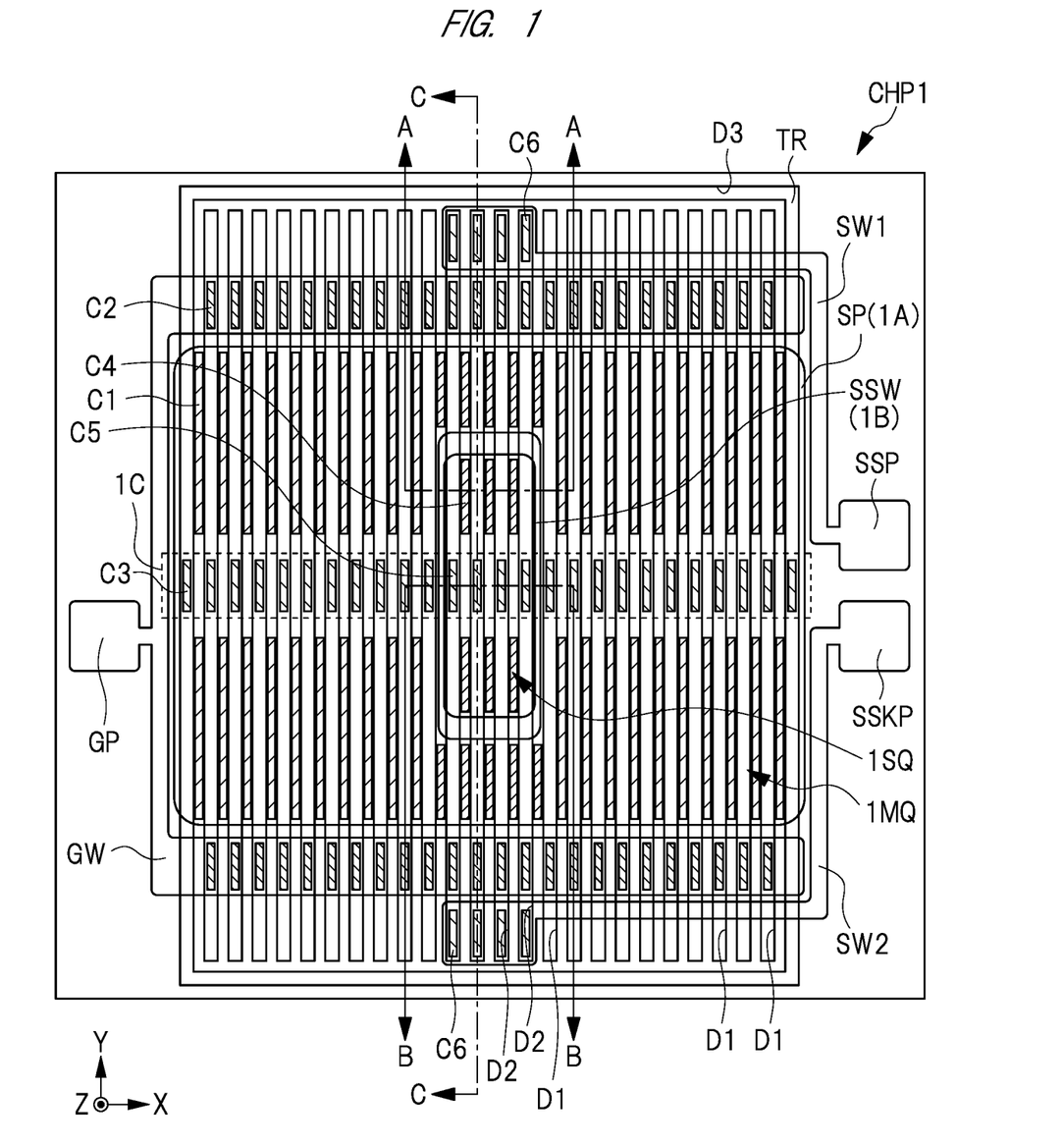
FIG. 1 is a planar layout showing a semiconductor device according to the first embodiment.
Figure 2:
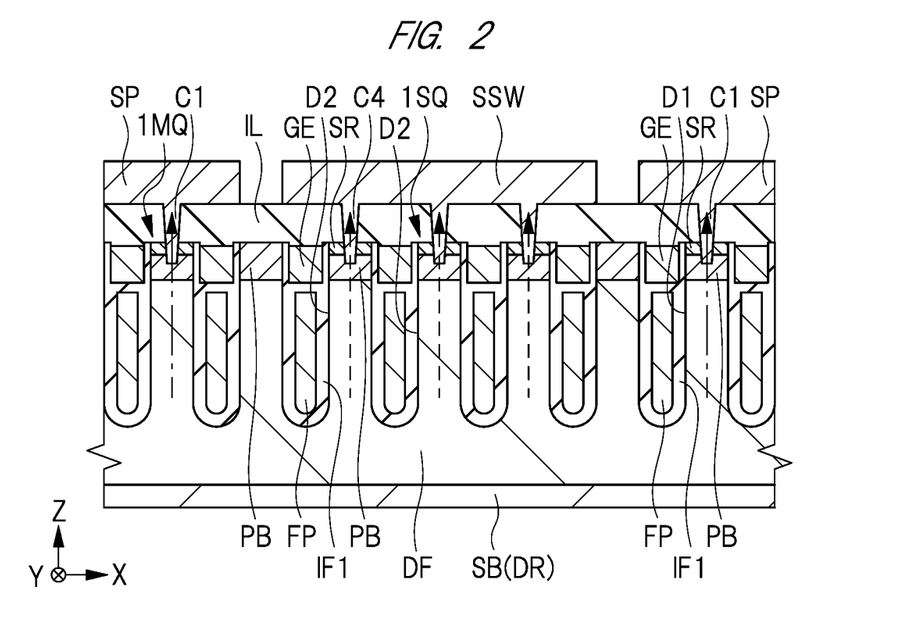
FIG. 2 is a cross-sectional view taken along the line A-A in FIG. 1.
Figure 3:
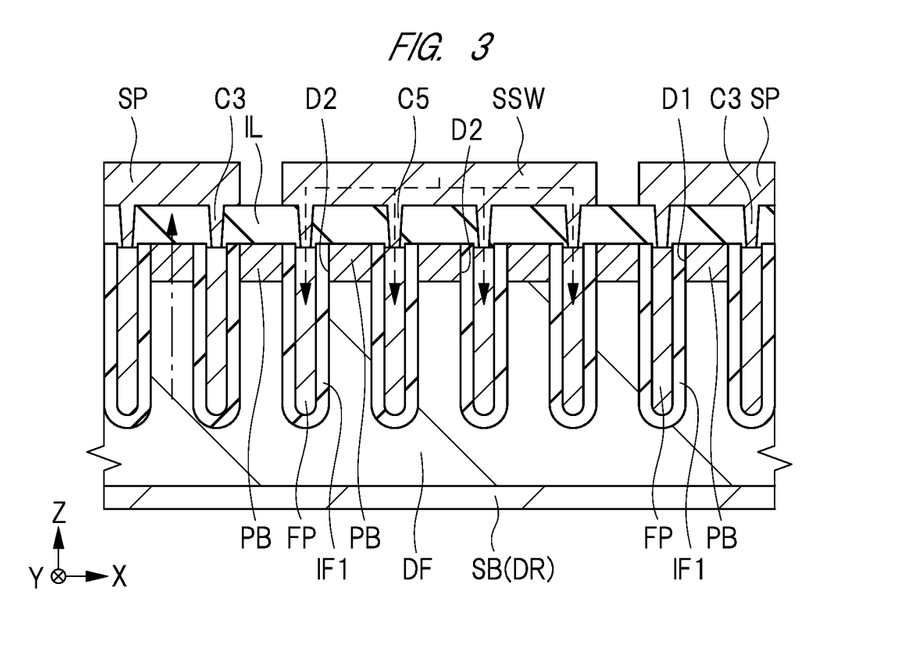
FIG. 3 is a cross-sectional view taken along the line B-B in FIG. 1.
Figure 4:
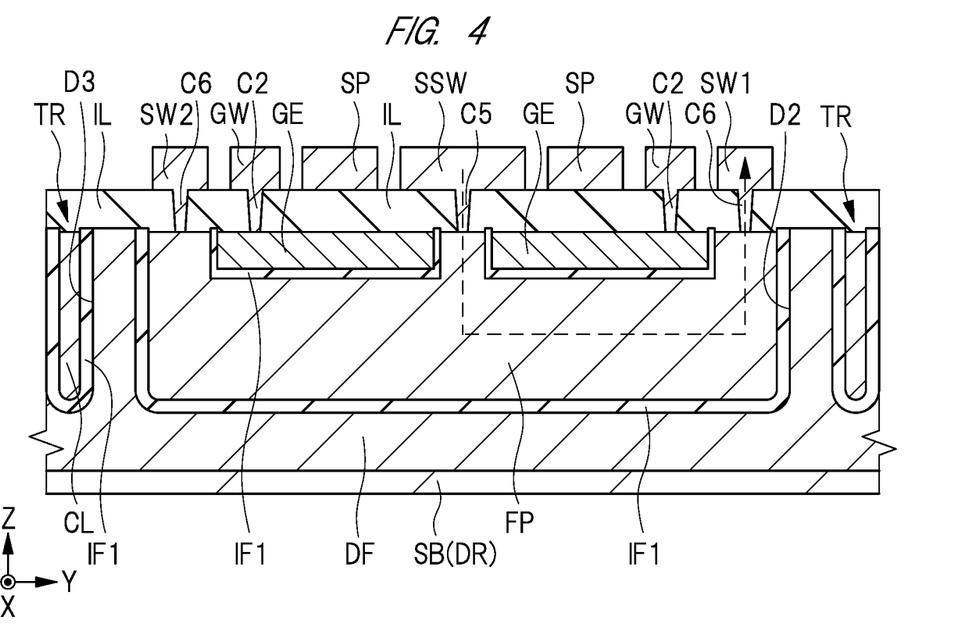
FIG. 4 is a cross-sectional view taken along the line C-C in FIG. 1.

As shown in FIG. 1, the semiconductor device of the present embodiment is a semiconductor chip CHP1 having a semiconductor substrate, and the semiconductor chip CHP1 includes a main MOSFET 1MQ and a sense MOSFET 1SQ. FIG. 2 shows a cross-sectional view taken along the line A-A in FIG. 1. FIG. 3 shows a cross-sectional view taken along the line B-B in FIG. 1. FIG. 4 shows a cross-sectional view taken along the line C-C in FIG. 1. The semiconductor substrate has an upper surface (first main surface) and a lower surface (second main surface) opposite to the upper surface. In FIG. 1, the structure under the wiring formed on the upper surface of the semiconductor substrate is transparently shown, and illustrations of insulating films such as an interlayer insulating film and a passivation film on the semiconductor substrate are omitted.

As shown in FIG. 2, the semiconductor substrate constituting the semiconductor device of the present embodiment includes a substrate SB made of, for example, single crystal Si (silicon) and a drift layer DF which is a semiconductor layer formed on the substrate SB by the epitaxial growth method or the like. The substrate SB constitutes an $n^+$ type drain region DR. Although not shown, the lower surface of the substrate SB is covered with a drain electrode containing, for example, Au (gold), and the drain region DR is connected to the drain electrode. The drift layer DF is an $n^-$ type semiconductor layer.

As shown in FIG. 1, a plurality of trenches D2 and trenches D1 extending in the Y direction is formed so as to be arranged in the X direction on the upper surface of the semiconductor substrate. Specifically, two groups in which the trenches D1 are arranged in the X direction are formed side by side in the X direction, and the plurality of trenches D2 is formed and arranged in the X direction between the two groups of trenches D1. The main MOSFET 1MQ is formed in the vicinity of the trenches D1. The main MOSFET 1MQ, the sense MOSFET 1SQ, and the main MOSFET 1MQ arranged in order in the Y direction are formed in the vicinity of the trenches D2.

Namely, the main MOSFETs are formed around the sense MOSFET 1SQ. Specifically, the sense MOSFET 1SQ is located in the central portion of the semiconductor chip CHP1 in plan view. The Y direction and the X direction are directions along the upper surface of the semiconductor substrate, respectively, and are directions orthogonal to each other in plan view. Also, the Z direction orthogonal to each of the Y direction and the X direction is the height direction (thickness direction, vertical direction, longitudinal direction) perpendicular to the upper surface of the semiconductor substrate.

Further, in the upper surface of the semiconductor substrate, a trench D3 is formed so as to surround the active region in which the sense MOSFET 1SQ and the main MOSFET 1MQ are formed in plan view. As shown in FIG. 4, a conductive film CL is buried in the trench D3 via an insulating film IF1, and the trench D1, the insulating film IF1, and the conductive film CL constitute a termination ring TR. The periphery of the active region is surrounded by the annular termination ring TR in plan view (see FIG. 1). Although not shown here, on the upper surface of the semiconductor substrate in a peripheral portion of the semiconductor chip CHP1, a seal ring having a structure similar to that of the termination ring TR may be formed in the vicinity of the peripheral portion of the semiconductor chip CHP1 so as to surround the termination ring TR. The active region includes a region 1A in which the main MOSFET is formed and which has an annular shape in plan view and a region 1B which is surrounded by the annular region 1A and in which the sense MOSFET 1SQ is formed. In plan view, the trench D3 surrounds the regions 1A and 1B and the trenches D1 and D2.

As shown in FIG. 2 to FIG. 4, a gate wiring GW and a field plate electrode FP below the gate wiring GW are buried in each of the trenches D1 and D2 via the insulating film IF1. The structure in which two electrodes are formed in the trench is referred to as a double-gate structure (double-gate type) here. In the active region, on the upper surface of the semiconductor substrate (upper surface of the drift layer DF), body layers PB which are p type semiconductor layers are formed in contact with side surfaces of the trenches D1 and D2. The depth of the body layer PB is shallower than, for example, the depth of any of the trenches D1 and D2 and the gate electrode GE.

Also, in each of the regions 1A and 1B which are active regions, on the upper surface of the semiconductor substrate (upper surface of the drift layer DF), source regions SR which are $n^+$ type semiconductor regions ($n^+$ diffusion layers) are formed in contact with the side surfaces of the trenches D1 and D2. Namely, the source region SR is in contact with the upper surface of the semiconductor substrate. The depth of the source region SR is shallower than the depth of any of the body layer PB and the gate electrode GE. The lower surface of the source region SR is in contact with the body layer PB, and the lower surface of the body layer PB is in contact with the drift layer DF.

The source region SR, the drain region DR, the body layer PB, and the gate electrode GE of the region 1A constitute the n type main MOSFET 1MQ which is a vertical MOSFET. The source region SR, the drain region DR, the body layer PB, and the gate electrode GE of the region 1B constitute the n type sense MOSFET 1SQ which is a vertical MOSFET. Among the gate electrodes GE in the trenches D2, the gate electrodes GE located in the region 1A outside the region 1B in the Y direction constitute the main MOSFET 1MQ instead of the sense MOSFET 1SQ.

Figure 5:
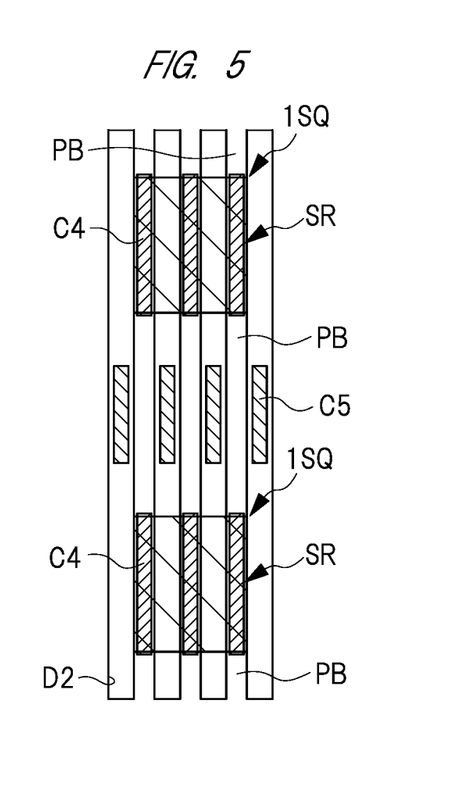
FIG. 5 is an enlarged planar layout showing a part of the semiconductor device according to the first embodiment.

FIG. 5 is a planar layout showing the vicinity of the formation region of the sense MOSFET 1SQ in an enlarged manner. In FIG. 5, the region in which the source region SR of the sense MOSFET 1SQ is formed is shown by hatching, and illustrations of pads and wiring on the semiconductor substrate are omitted. As shown in FIG. 5, the formation region of the source region SR constituting the sense MOSFET 1SQ is surrounded by the formation region of the body layer PB in plan view. Namely, both side surfaces in the Y direction and the bottom surface of the source region SR of the sense MOSFET 1SQ formed between the trenches D2 adjacent in the X direction are continuously covered with the body layer PB. Further, the side surfaces of the source region SR of the sense MOSFET 1SQ in the X direction are covered with the insulating film IF1 in the trench D2 or the contact plug C4. Therefore, the source region SR constituting the sense MOSFET 1SQ and the source region SR (not shown) constituting the main MOSFET 1MQ are separated from each other by the body layer PB.

As shown in FIG. 1 to FIG. 4, a metal film (conductive film, source wiring) constituting a source pad SP, wirings SSW, SW1, and SW2, and the gate wiring GW are formed on each of the semiconductor substrate, the gate electrode GE, the insulating film IF1, and the conductive film CL via an interlayer insulating film IL. The interlayer insulating film IL is mainly made of, for example, silicon oxide. The metal film (conductive film, source wiring) constituting the source pad SP, the wirings SSW, SW1, and SW2, and the gate wiring GW are made of, for example, Al (aluminum), are located at the same height, and are separated from each other.

A plurality of openings (through holes) is formed in the interlayer insulating film IL. In these openings, contact plugs (conductive connection portions) integrated with the metal film (source wiring) constituting the source pad SP, the wirings SSW, SW1, and SW2, or the gate wiring GW are formed. Each contact plug extends along the extending direction (Y direction) of the trenches D1 and D2. Strictly speaking, the source pad SP indicates a portion of the upper surface of the metal film (source wiring) that is exposed from an insulating film (not shown) such as a passivation film, but the metal film is referred to as the source pad SP below.

Specifically, the source pad SP is formed in the region 1A and has an annular structure in plan view. The source pad SP is electrically connected to the source region SR and the body layer PB via a contact plug C1. The contact plug C1 reaches the intermediate depth of the body layer PB, which is deeper than the source region SR, and is in contact with the source region SR. In order to reduce the connection resistance between the contact plug C1 and the body layer PB, a p type semiconductor region having a concentration higher than that of the body layer PB may be formed in the semiconductor substrate between the contact plug C1 and the body layer PB.

The gate wiring GW is formed outside the source pad SP in the Y direction so as to be adjacent to the source pad SP and extends in the X direction. A part of the gate wiring GW and another part thereof are arranged so as to sandwich the source pad SP in the Y direction. The gate wiring GW is electrically connected to the gate electrode GE inside each of the trenches D1 and D2 via a contact plug C2. A part of the upper surface of the gate wiring GW constitutes the gate pad GP, and a gate potential is supplied to the gate electrode GE via the gate pad GP, the gate wiring GW, and the contact plug C2.

The source pad SP is electrically connected to the field plate electrode FP in the trench D1 via a contact plug C3. Namely, the field plate electrode FP in the trench D1 separated from the region 1B in plan view is electrically connected to the source pad SP. The contact plug C3 is located at the center of the semiconductor chip CHP1 in the Y direction and is formed in a region 1C extending in the X direction. The region 1C is a region that overlaps with the regions 1A and 1B in plan view. In the region 1C, the gate electrode GE is not formed inside each of the trenches D1 and D2. Namely, in each of the trenches D1 and D2 in the region 1C, the field plate electrode FP is buried from the vicinity of the lower end to the vicinity of the upper end of each of the trenches D1 and D2. Also, the source pad SP is electrically connected to the conductive film CL constituting the termination ring TR via the contact plug C3.

The wiring (sense source wiring) SSW is formed in the region 1B. Namely, the wiring SSW is surrounded by the source pad SP in plan view. The wiring SSW is electrically connected to the source region SR and the body layer PB via a contact plug C4. The contact plug C4 reaches the intermediate depth of the body layer PB, which is deeper than the source region SR, and is in contact with the source region SR. In order to reduce the connection resistance between the contact plug C4 and the body layer PB, a p type semiconductor region having a concentration higher than that of the body layer PB may be formed in the semiconductor substrate between the contact plug C4 and the body layer PB.

In addition, the wiring SSW is electrically connected to the field plate electrode FP in the trench D2 via a contact plug C5. The contact plug C5 is formed in the region 1C overlapping with the region 1B in plan view.

The wirings SW1 and SW2 are aligned with the region 1B in the Y direction, and are electrically connected to the field plate electrodes FP in the trenches D2 via contact plugs C6 in two regions sandwiching the source pad SP and the gate wiring GW in plan view. The gate electrode GE is not formed in the trench D2 in the two regions. Namely, in the trenches D2 in these regions, the field plate electrode FP is buried from the vicinity of the lower end to the vicinity of the upper end of the trench D2.

The wiring SW1 is led out to the end of the semiconductor chip CHP1, and a part of the upper surface of the wiring SW1 at the end constitutes a sense source pad SSP. In addition, the wiring SW2 is led out to the end of the semiconductor chip CHP1, and a part of the upper surface of the wiring SW2 at the end constitutes a sense source pad SSKP. The sense source pad SSKP is a Kelvin pad having a function of detecting the potential of the wiring SSW. A source potential is supplied to the source region SR constituting the sense MOSFET 1SQ via the sense source pad SSP, the wiring SW1, the contact plug C6, the field plate electrode FP in the trench D2, the contact plug C5, the wiring SSW, and the contact plug C4.

Here, the operation of each MOSFET will be described. When the main MOSFET 1MQ is in the ON state, a channel (inversion layer) is formed in the body layer PB adjacent to the trench D2 in which the gate electrode GE is provided, and a current flows from the drain region DR to the source region SR through the drift layer DF and the corresponding channel in the body layer PB (see the dash-dotted arrow in FIG. 2).

When the sense MOSFET 1SQ is in the ON state, a channel (inversion layer) is formed in the body layer PB adjacent to the trench D2 in which the gate electrode GE is provided, and a current flows from the drain region DR to the source region SR through the drift layer DF and the corresponding channel in the body layer PB (see the dashed arrow in FIG. 2). A part of the current of the sense MOSFET 1SQ that has thus flown to the source region SR flows to the sense source pad SSP through the wiring SSW, the field plate electrode FP in the trench D2, and the wiring SW1 as indicated by the dashed arrows in FIG. 2, FIG. 3, and FIG. 4. Also, another part of the current of the sense MOSFET 1SQ that has flown to the source region SR flows to the sense source pad SSKP through the wiring SSW, the field plate electrode FP in the trench D2, and the wiring SW2.

Here, the source potential of the sense MOSFET 1SQ can be taken out from the central portion of the semiconductor chip CHP1 in the Y direction to the sense source pad SSKP through the field plate electrode FP. Therefore, the potential of the sense MOSFET 1SQ in the central portion of the semiconductor chip CHP1 in the Y direction can be detected, so that the potential can be detected more stably.

Since each MOSFET in the present embodiment is a trench double-gate power MOSFET and has in its trench a field plate electrode to which a source potential is applied, it is possible to suppress the parasitic capacitance of the MOSFET and increase the switching speed of the MOSFET.

Figure 6:
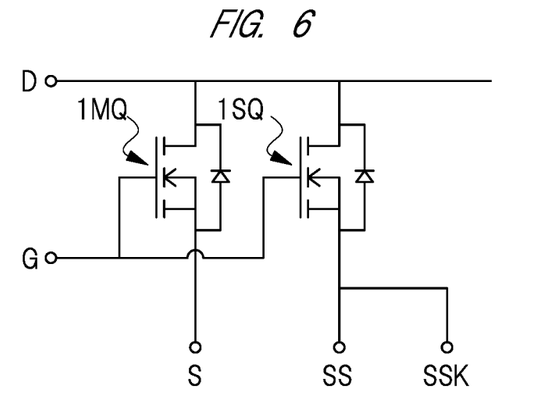
FIG. 6 is an equivalent circuit diagram showing the semiconductor device according to the first embodiment.

FIG. 6 shows an equivalent circuit diagram of the semiconductor device according to the present embodiment. As shown in FIG. 6, the main MOSFET 1MQ and the sense MOSFET 1SQ share a drain D and each have a built-in diode. The built-in diode is composed of a pn junction between the body layer PB which is a p type layer connected to the contact plug C1 or C4 shown in FIG. 2 and an n type layer composed of the drift layer DF and the drain region DR. The source region of the sense MOSFET 1SQ is connected to the source S (sense source pad SSP) and the source SSK (sense source pad SSKP).

One of the main features of the semiconductor device according to the present embodiment is that the sense MOSFET 1SQ is formed in the central portion of the semiconductor chip CHP1 and the sense MOSFET 1SQ is continuously surrounded by the source pad SP in plan view.

Another main feature of the semiconductor device according to the present embodiment is that no multilayer wiring layer is formed on the semiconductor substrate. Namely, no other wiring (wiring layer) is formed between each of the source pad SP, the wirings SSW, SW1, and SW2, and the gate wiring GW made of the metal film of the same layer and the semiconductor substrate. The wiring mentioned here is a wiring planarly extending in the X direction or the Y direction in plan view, except for the metal film, the semiconductor substrate, the gate electrode GE, and the contact plugs C1 to C6 connected to the field plate electrode FP or the conductive film CL.

Effects of Present Embodiment

As described in SUMMARY above, a die bond crack progresses from an outer periphery of a chip in a reliability test in which a heat load is applied to the semiconductor chip. Therefore, it is conceivable that the crack extends to just below the sense MOSFET if the sense MOSFET is formed near the outer periphery of the chip. In this case, since the resistance of the sense MOSFET changes, the sense ratio fluctuates greatly, and the current detection using the sense MOSFET becomes difficult. Therefore, it is desirable that the sense MOSFET is arranged in the central portion of the chip.

Thus, in the present embodiment, the sense MOSFET is formed in the central portion of the semiconductor chip. Here, the source potential is supplied to the source region of the sense MOSFET by using the field plate electrode in the trench. Therefore, here, the source pad is cut out and is not formed for the region where the sense MOSFET is formed, and it is thus not necessary to divide the source pad of the main MOSFET as in Patent Document 1 in order to lead out the source wiring of the sense MOSFET. Namely, the sense MOSFET can be continuously surrounded by the source pad SP in plan view. As a result, it is possible to prevent the deterioration of the chip performance and the restriction on the bonding layout due to the reduction in the area of the source pad.

Further, it is not necessary to add a wiring layer on the semiconductor substrate in order to supply the source potential to the source region of the sense MOSFET at the center of the semiconductor chip. Namely, there is no need to add a manufacturing process or a mask for patterning as compared with the case where the sense MOSFET is arranged at the end of the semiconductor chip. Therefore, it is possible to prevent the increase in manufacturing cost of the semiconductor device. Moreover, since there is no need to use a multilayer wiring board, it is possible to prevent the increase in the size of the semiconductor device.

Specifically, according to the present embodiment, malfunction of the sense MOSFET due to the occurrence of die bond cracks can be prevented, thereby improving the performance of the semiconductor device while ensuring the reliability of the semiconductor device.

<First Modification>

The structure obtained by adding a bypass diode (protection diode) and a Kelvin pad of a main MOSFET to the structure described above will be described with reference to FIG. 7 to FIG. 11.

Figure 7:
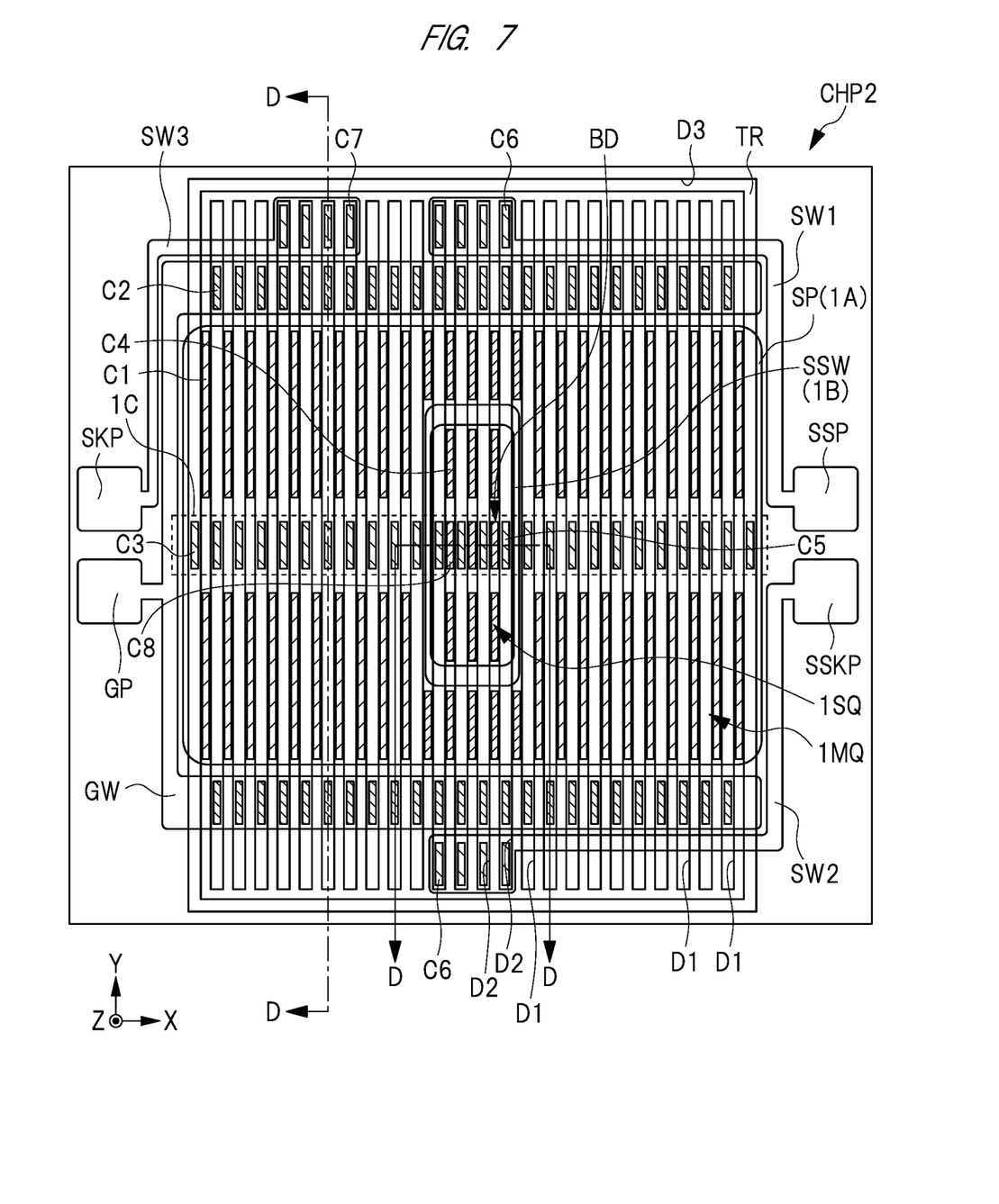
FIG. 7 is a planar layout showing a semiconductor device according to the first modification of the first embodiment.
Figure 8:
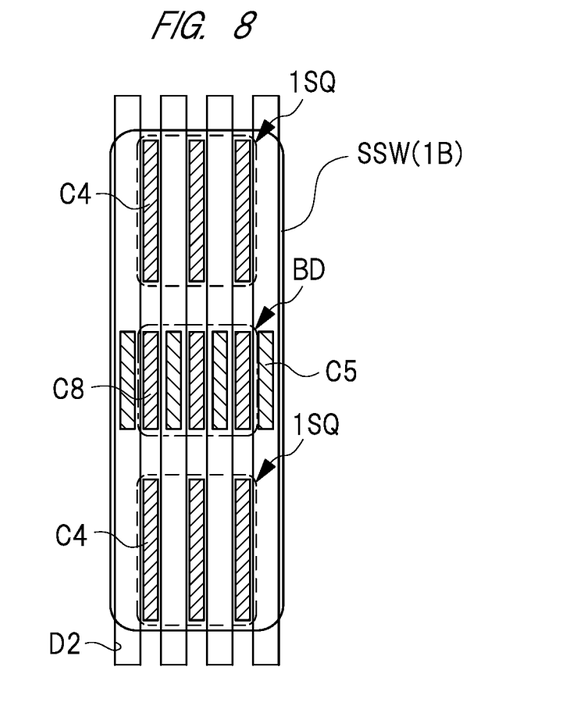
FIG. 8 is an enlarged planar layout showing a part of the semiconductor device according to the first modification of the first embodiment.
Figure 10:
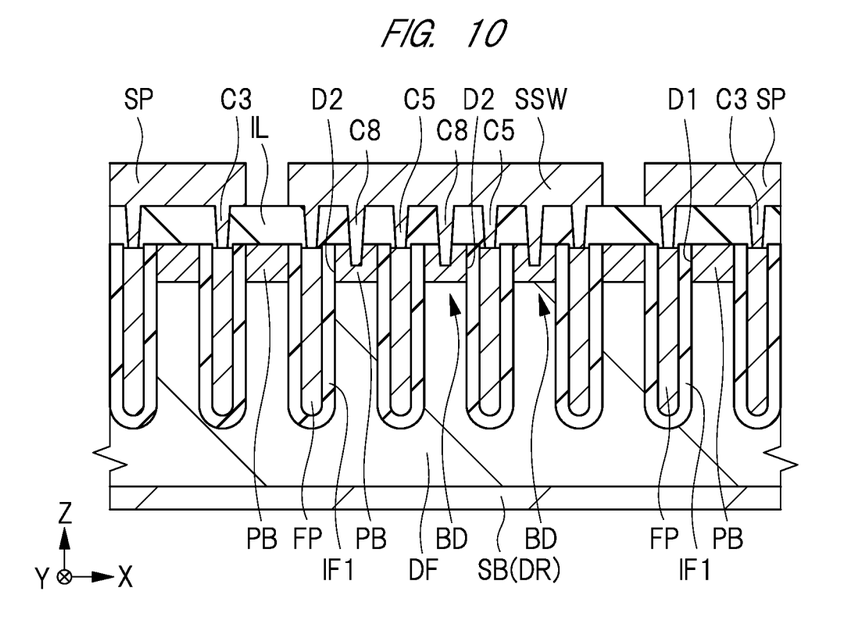
FIG. 10 is a cross-sectional view taken along the line E-E in FIG. 8.

In this modification, unlike the structure described with reference to FIG. 1 to FIG. 6, a contact plug C8 integrated with the wiring SSW is formed through the interlayer insulating film IL between the contact plugs C5 adjacent to each other in the X direction, in a region where regions 1B and 1C of a semiconductor chip CHP2 overlap with each other as shown in FIG. 7, FIG. 8, and FIG. 10. The contact plug C8 is connected to the body layer PB formed on the upper surface of the semiconductor substrate between the trenches D2 adjacent to each other. Since the source region SR is not formed in the region 1C, the contact plug C8 is not in contact with the source region SR. In other words, the contact plug C8 is separated from the source region SR.

The contact plug C8 is electrically connected to a bypass diode BD formed in the semiconductor substrate. In FIG. 8, the formation region of the sense MOSFET 1SQ is surrounded by a dashed line, and the formation region of the bypass diode BD is surrounded by a dash-dotted line.

Figure 11:
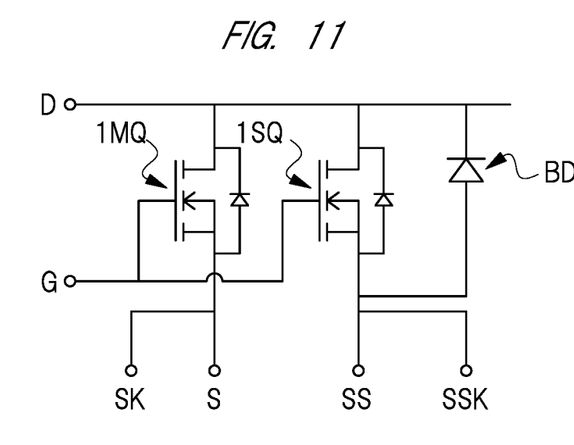
FIG. 11 is an equivalent circuit diagram showing the semiconductor device according to the first modification of the first embodiment.

The bypass diode BD is connected in parallel between the source and drain of the sense MOSFET 1SQ. The bypass diode BD is composed of a pn junction between the body layer PB which is a p type layer connected to the contact plug C8 shown in FIG. 10 and an n type layer composed of the drift layer DF and the drain region DR. As shown in FIG. 11, an anode of the bypass diode BD is connected to the source S and a cathode thereof is connected to the drain D. The bypass diode has a function of ensuring the ESD (Electro-Static Discharge) resistance of the semiconductor device. Namely, if the bypass diode BD is formed, for example, when static electricity is discharged to the wiring SSW or the like, the current can flow to the drain via the bypass diode BD, thereby preventing the semiconductor element from being damaged by the high voltage.

Figure 9:
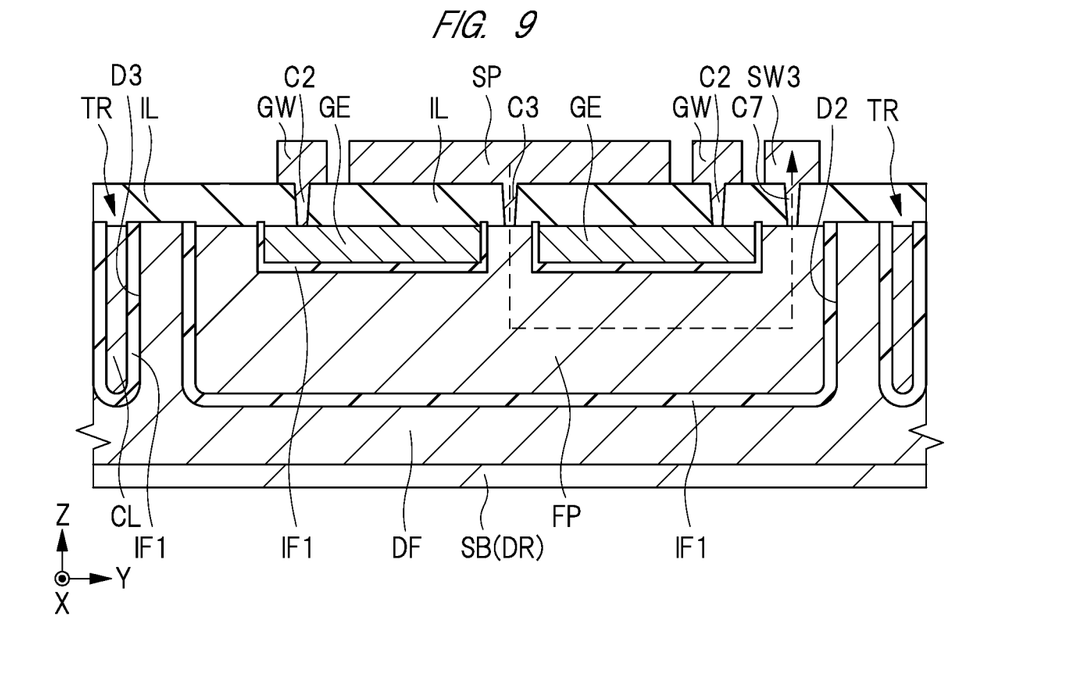
FIG. 9 is a cross-sectional view taken along the line D-D in FIG. 8.

Further, as shown in FIG. 7, FIG. 9, and FIG. 11, a source pad SKP, which is a Kelvin pad for detecting the source potential of the main MOSFET, is formed here. A wiring SW3 having the source pad SKP on a part of its upper surface is a wiring located at the same height as the source pad SP, the wirings SSW, SW1, and SW2, and the gate wiring GW. For example, the wiring SW3 is formed directly above the trench D1 at a position adjacent to a portion of the wiring SW1 or SW2 connected to the contact plug C6 in the X direction. The wiring SW3 is electrically connected to the field plate electrode FP in the trench D1 via a contact plug C7 outside the source pad SP and the gate wiring GW in the Y direction. As shown in FIG. 11, the source region of the main MOSFET 1MQ is connected to the source S (source pad SP) and the source SK (source pad SKP).

As a result, the source potential of the main MOSFET 1MQ can be taken out from the central portion of the semiconductor chip CHP2 in the Y direction through the field plate electrode FP. Therefore, since it is possible to detect the potential of the main MOSFET 1MQ in the central portion of the semiconductor chip CHP2 in the Y direction, the potential can be detected more stably.

<Second Modification>

Figure 12:
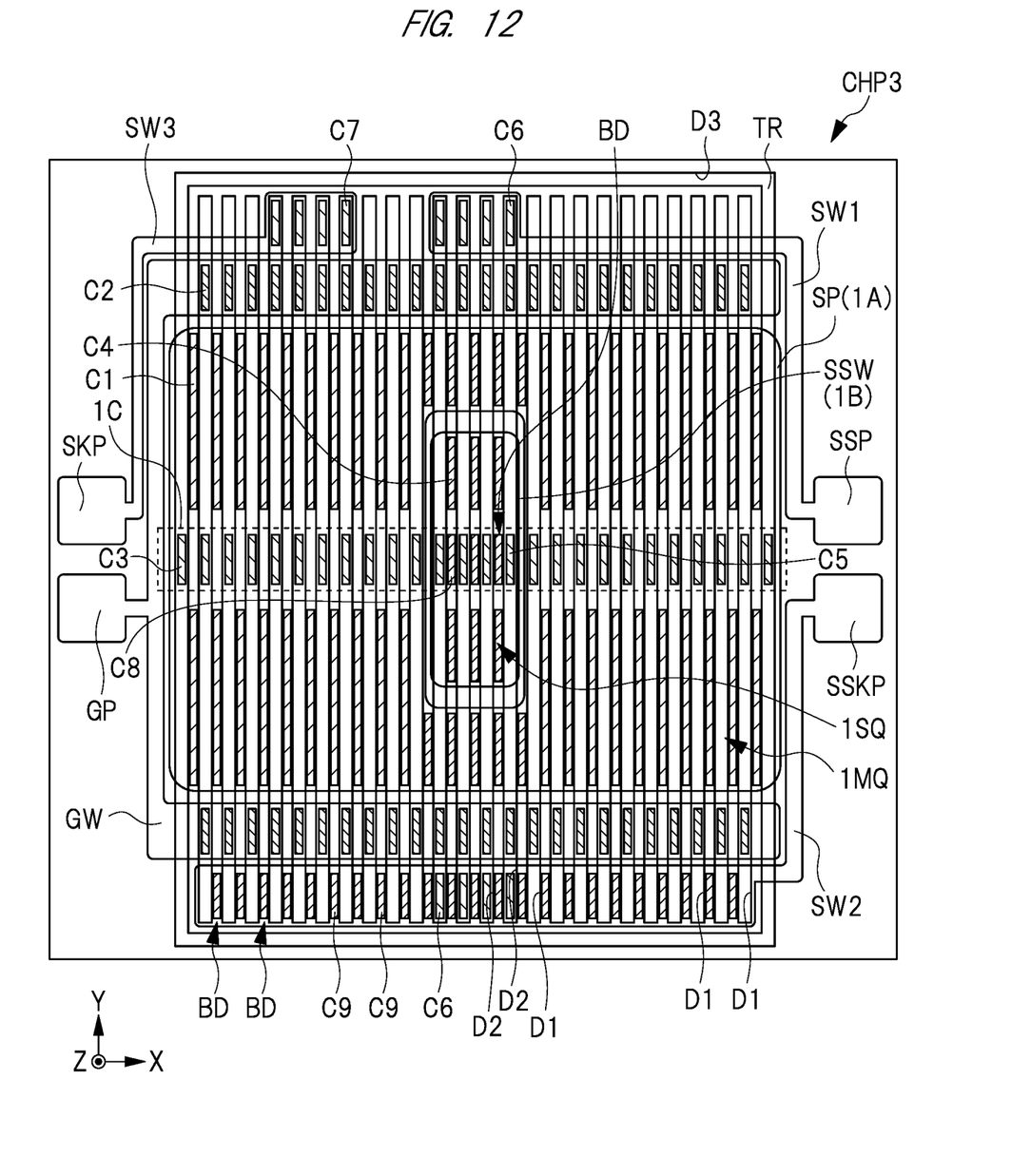
FIG. 12 is a planar layout showing a semiconductor device according to the second modification of the first embodiment.

FIG. 12 shows a planar layout in which the bypass diodes BD are connected to all the main MOSFETs 1MQ in the region 1A of a semiconductor chip CHP3. As shown in FIG. 12, outside the source pad SP and the gate wiring GW in the Y direction, contact plugs C9 are formed on the semiconductor substrate between the trenches D1 adjacent to each other, between the trenches D2 adjacent to each other, and between the trenches D1 and D2 adjacent to each other. Like the contact plug C8, the contact plug C9 is connected to the body layer PB formed on the upper surface of the semiconductor substrate, and the body layer PB constitutes the anode of the bypass diode BD. A plurality of contact plugs C9 arranged in the X direction is integrated with the wiring SW2 extending in the X direction. Namely, these bypass diodes BD are electrically connected to the sense source pad SSKP via the contact plugs C9 and the wiring SW2.

In this modification, since the bypass diode (protection diode) with an area larger than that the first modification described above can be formed, the ESD resistance can be improved even with a sense MOSFET having a small area.

Second Embodiment

Figure 14:
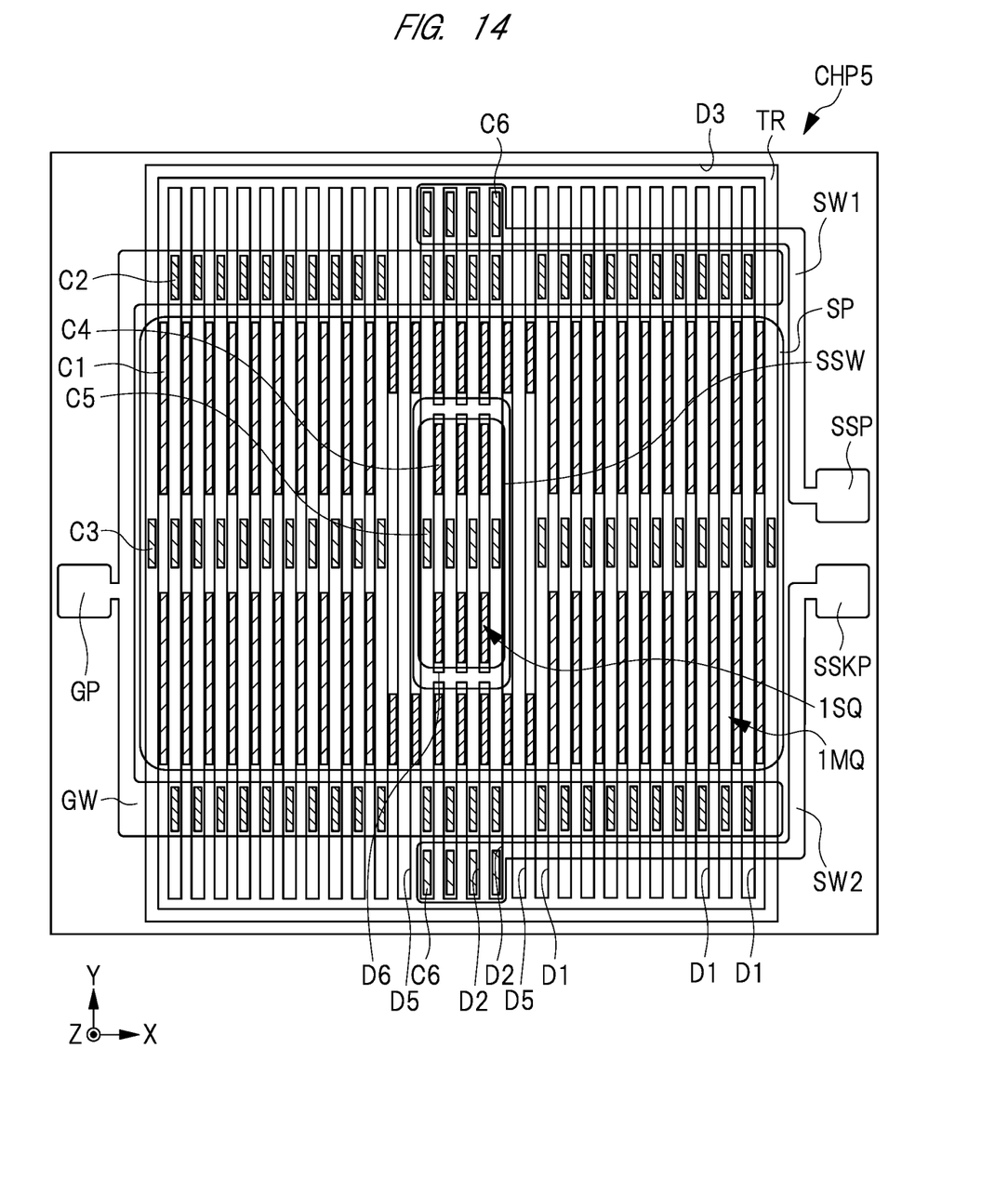
FIG. 14 is a planar layout showing the semiconductor device according to the second embodiment.
Figure 15:
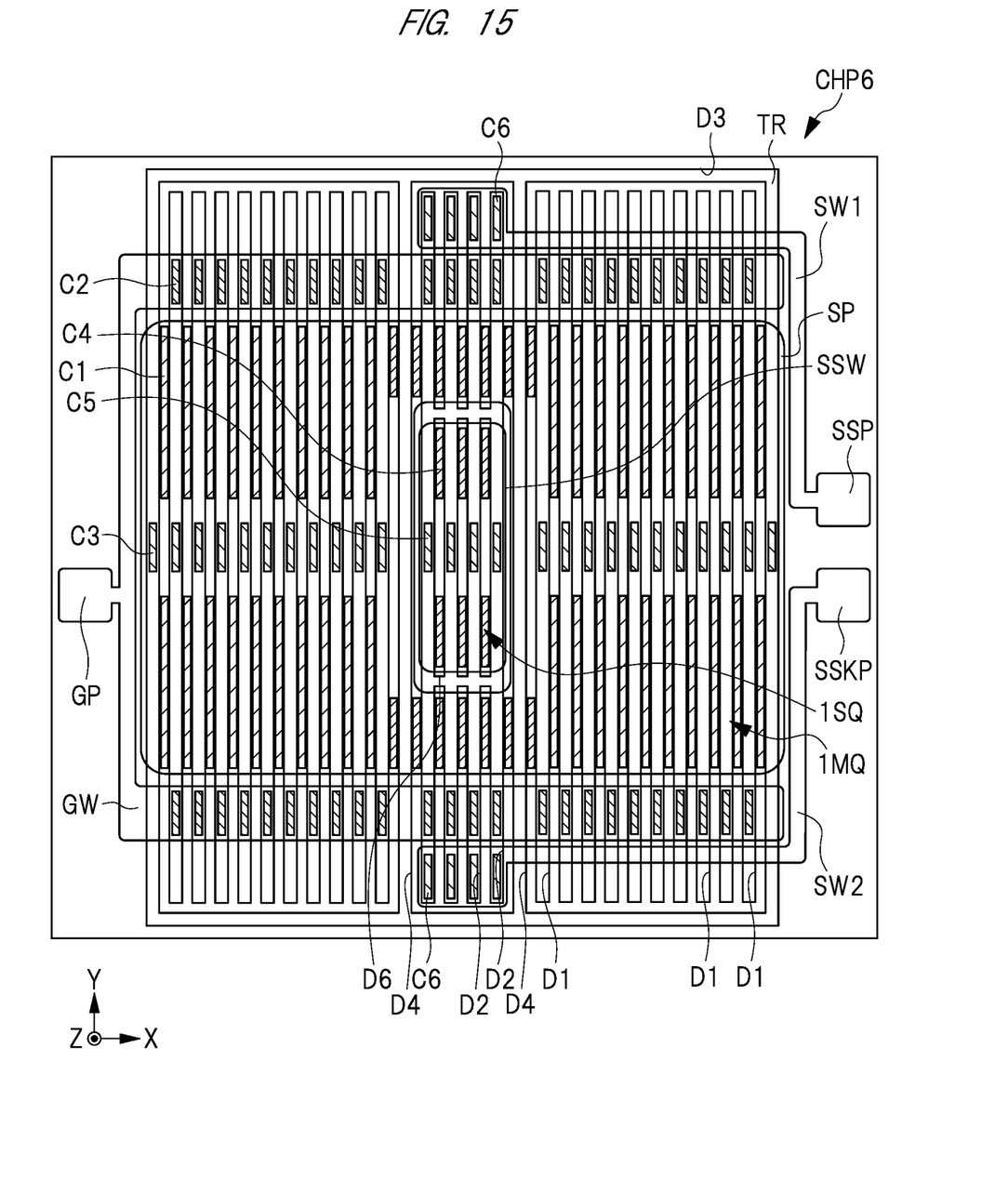
FIG. 15 is a planar layout showing the semiconductor device according to the second embodiment.

A structure provided with a trench for element isolation will be described with reference to FIG. 13 to FIG. 15. Each of FIG. 13 to FIG. 15 is a planar layout showing an example of the semiconductor device according to the present embodiment.

Figure 13:
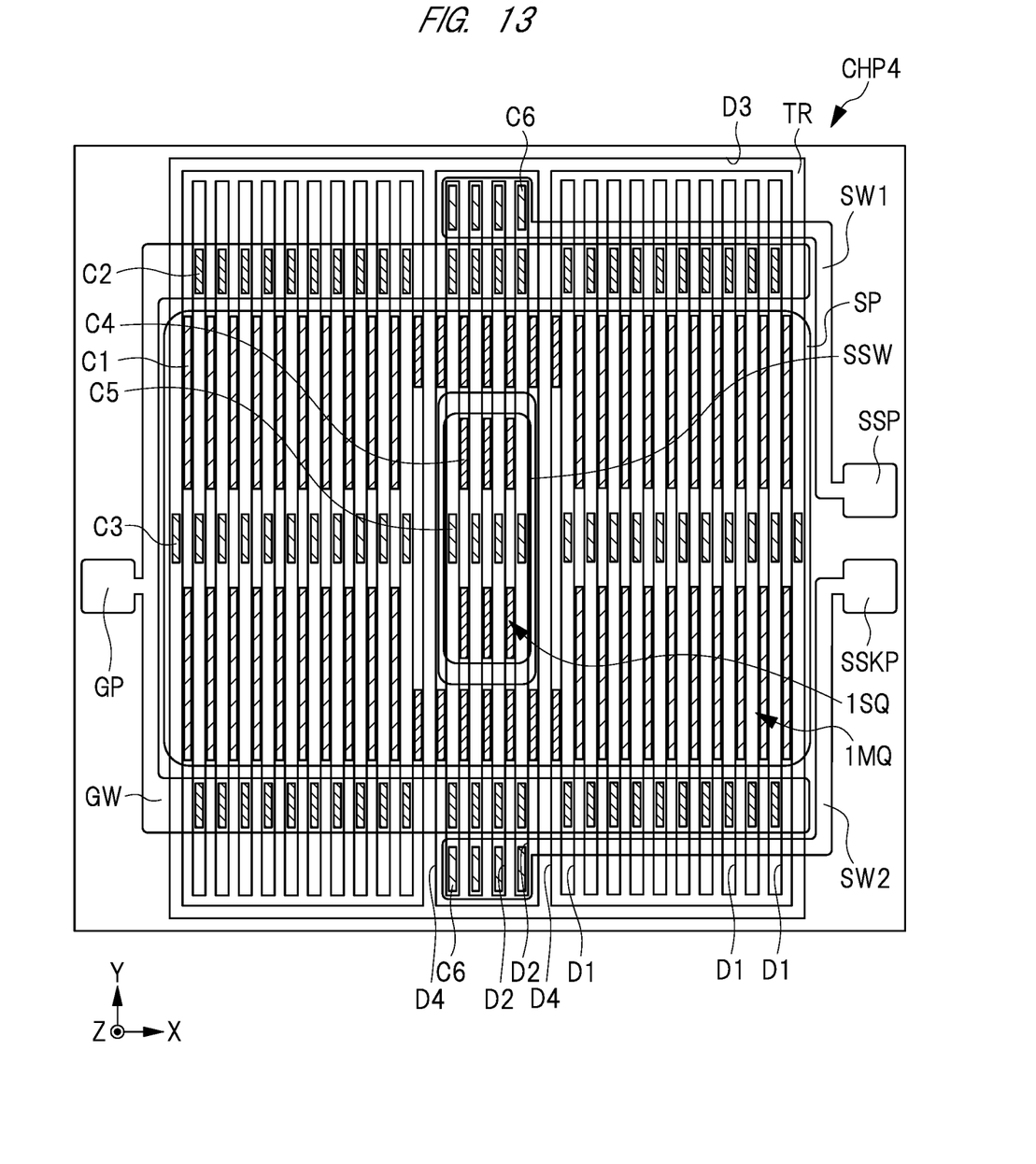
FIG. 13 is a planar layout showing a semiconductor device according to the second embodiment.

As shown in FIG. 13, in a semiconductor chip CHP4, a trench D4 extending in the Y direction is formed between the trench D2 in the region 1B and the trench D1 in the region 1A. The depth of the trench D4 is the same as those of the trenches D1 to D3. The trench D4 is connected to the trench D3 at both ends in the Y direction. The structure in the trench D4 may be the same as those in the trenches D1 and D2, or may be the same as that in the trench D3. Namely, the number of electrodes in the trench D4 may be one or two. This holds true for trenches D5 and D6 described later.

Although FIG. 13 does not show the contact plug connected to the conductive film in the trench D4, the contact plug similar to the contact plugs C2, C3, and C5 may be connected to the conductive film. This holds true for the trench D5 described later.

The source pads SP and the sense source pads SSP of the sense MOSFET 1SQ and the main MOSFET 1MQ need to be electrically isolated from each other. When the voltage applied to the semiconductor device is high and high withstand voltage performance is required, it is conceivable to secure a relatively large distance between the elements for element isolation between the sense MOSFET 1SQ and the main MOSFET 1MQ. However, in that case, the size of the semiconductor device increases.

Therefore, the trench D4 is provided in the present embodiment. The trench D4 is a pseudo trench provided to improve insulation between the sense MOSFET 1SQ and the main MOSFET 1MQ in the X direction. The pseudo trench mentioned here means a trench that does not constitute a trench of a trench-type MOSFET. Namely, the conductive film inside the pseudo trench does not function as the gate electrode of the MOSFET. Here, as compared with the case where the distance is increased without providing a trench between the sense MOSFET and the main MOSFET, the increase in the size of the semiconductor device can be suppressed, and the insulation between the sense MOSFET 1SQ and the main MOSFET 1MQ in the X direction can be improved.

In FIG. 14, in a semiconductor chip CHP5, a trench D5 having the same structure as that of the trench D4 except for the planar layout is formed. Namely, the trench D5 differs from trench D4 in that it is not connected to the trench D3. In other words, the trench D5 is separated from the trench D3 like the trenches D1 and D2. Also, here, a trench D6 extending in the X direction is formed between the region 1B and the region 1A in the Y direction. The trench D6 intersects with a plurality of trenches D2 arranged in the X direction in plan view, and is connected to these trenches D2. The trench D6 is formed between the contact plug C1 and the contact plug C4 adjacent in the Y direction. The trench D6 is a pseudo trench provided for improving insulation between elements like the trenches D4 and D5.

Here, the insulation between the sense MOSFET 1SQ and the main MOSFET 1MQ in the X direction is improved by providing the trench D5, and the insulation between the sense MOSFET 1SQ and the main MOSFET 1MQ in the Y direction is improved by providing the trench D6.

Further, FIG. 15 shows a structure obtained by combining the structure shown in FIG. 13 and the structure shown in FIG. 14. Namely, a semiconductor chip CHP6 shown in FIG. 15 has the trenches D4 and D6. Since the trench D4 is connected to the trench D3, insulation between the sense MOSFET 1SQ and the main MOSFET 1MQ in the X direction can be improved as compared with the semiconductor chip CHP5 described with reference to FIG. 14.

Third Embodiment

Since the field plate electrode has a small cross-sectional area and a large resistance, if the source potential is supplied to the source region of the sense MOSFET by using a small number of field plate electrodes, there may be influence on wiring resistance.

Figure 16:
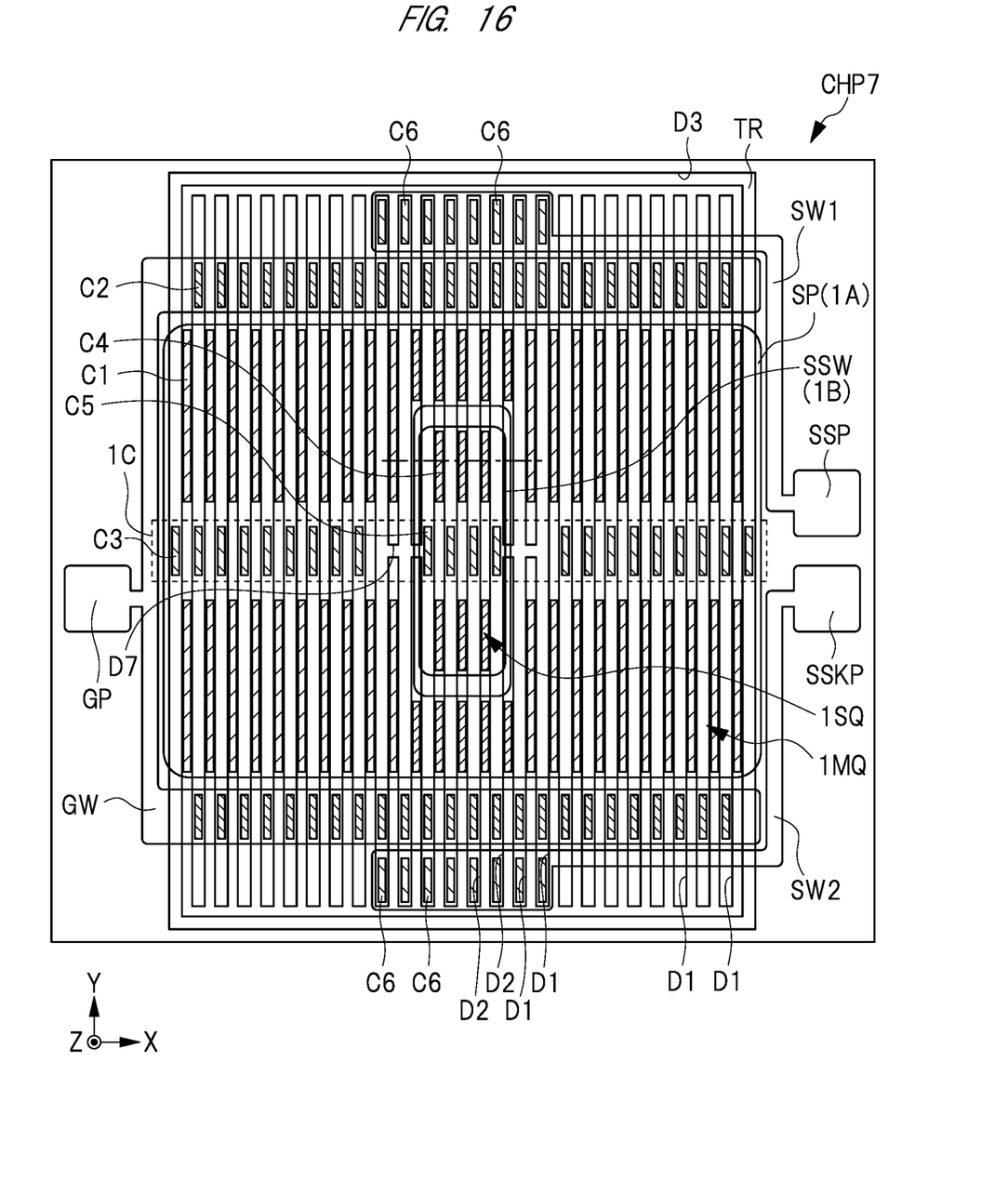
FIG. 16 is a planar layout showing a semiconductor device according to the third embodiment.

Therefore, in a semiconductor chip CHP7 according to the present embodiment, a part of the trench D1 adjacent to the trench D2 in the X direction is connected to the trench D2 by a trench D7 extending in the X direction as shown in FIG. 16. The insulating film IF1 and the field plate electrode FP are formed in the trench D7, as in the trench D2 of the region 1C. Namely, the field plate electrode FP in the trench D2 and the field plate electrode FP in the trench D1 aligned with the trench D2 are electrically connected via the field plate electrode FP in the trench D7. The trench D1 connected to the trench D7 is a trench separated from the region 1B and the wiring SSW in plan view.

The field plate electrode FP in the trench D1 connected to the trench D2 in this way is not connected to the source pad SP via the contact plug C3. Namely, the contact plug C3 is not formed directly above the trench D1. Specifically, the field plate electrode FP in the trench D1 connected to the trench D2 is insulated from the source pad SP. The trench D1 is electrically connected to the wirings SW1 and SW2 via the contact plugs C6 outside the source pad SP and the gate wiring GW in the Y direction.

In the present embodiment, the trenches are connected in the X direction to increase the number of field plate electrodes that lead out the source electrode of the sense MOSFET. Consequently, the resistance of the wiring that supplies the source potential to the source region of the sense MOSFET can be reduced.

In the foregoing, the invention made by the inventor of this application has been specifically described based on the embodiments, but it is needless to say that the present invention is not limited to the embodiments described above and can be modified in various ways within the scope not departing from the gist thereof.

For example, the polarities of the components of the MOSFETs described in the first to third embodiments may be inverted. In other words, each MOSFET may be a p type MOSFET.

What is claimed is:

1. A semiconductor device having a semiconductor chip in which a first field effect transistor and a second field effect transistor for current detection are formed, the semiconductor device comprising:
   a semiconductor substrate of a first conductivity type having a first main surface and a second main surface opposite to the first main surface, and having an annular first region and a second region surrounded by the first region in plan view;
   a plurality of first trenches formed from the first main surface of the semiconductor substrate to reach an intermediate depth of the semiconductor substrate, extending in a first direction along the first main surface of the semiconductor substrate, and arranged in a second direction orthogonal to the first direction in plan view;
   a first semiconductor region of a second conductivity type different from the first conductivity type formed in the semiconductor substrate so as to be in contact with side surfaces of the first trenches;
   a source region of the first conductivity type in contact with each side surface of the plurality of first trenches, the first main surface of the semiconductor substrate, and the first semiconductor region;
   a drain region of the first conductivity type formed in the semiconductor substrate including the second main surface of the semiconductor substrate;
   a gate electrode and a first electrode formed inside each of the plurality of first trenches via a first insulating film and insulated from each other; and
   a first wiring, a second wiring, and a source pad formed on the semiconductor substrate via an interlayer insulating film,
   wherein the gate electrode, the source region, the drain region, and the first semiconductor region of the first region constitute the first field effect transistor,
   wherein the gate electrode, the source region, the drain region, and the first semiconductor region of the second region constitute the second field effect transistor,
   wherein the source region of the first field effect transistor and the first electrode in the first trench separated from the second region in plan view are electrically connected to the source pad, and
   wherein, in plan view, the source region of the second field effect transistor is electrically connected to the second wiring located outside the source pad via the first wiring surrounded by the source pad and the first electrode in the first trench extending over the second region, the first region, and outside of the first region.

2. The semiconductor device according to claim 1, wherein the first wiring is located at the same height as a metal film constituting the source pad.

3. The semiconductor device according to claim 1, wherein no wiring layer is formed between a metal film constituting the first wiring, the second wiring, and the source pad and the first main surface of the semiconductor substrate.

4. The semiconductor device according to claim 1, wherein the second field effect transistor is located at a central portion of the semiconductor chip in plan view.

5. The semiconductor device according to claim 1 further comprising a first diode composed of a pn junction between the first semiconductor region and the semiconductor substrate of the second region, wherein the first wiring is connected to the first semiconductor region constituting the first diode via a first conductive connection portion.

6. The semiconductor device according to claim 1 further comprising a second diode composed of a pn junction between the first semiconductor region and the semiconductor substrate located outside the source pad in plan view,
wherein the second wiring is connected to the first semiconductor region constituting the second diode via a second conductive connection portion.

7. The semiconductor device according to claim 1 further comprising a third wiring located outside the source pad in plan view and formed on the semiconductor substrate via an interlayer insulating film,
wherein the first electrode in the first trench formed in the first region or the second region is electrically connected to the third wiring, and
wherein a part of the third wiring constitutes an electrode pad for potential detection.

8. The semiconductor device according to claim 1 further comprising a pseudo second trench formed in the first main surface of the semiconductor substrate between the first trench of the first region and the first trench of the second region in the second direction and extending in the first direction.

9. The semiconductor device according to claim 8 further comprising a third trench formed in the first main surface of the semiconductor substrate, surrounding the first region, the second region, and the plurality of first trenches, and having an annular structure in plan view,
wherein both ends of the second trench are connected to the third trench in the second direction.

10. The semiconductor device according to claim 1 further comprising a fourth trench formed in the first main surface of the semiconductor substrate, extending in the second direction, and connecting the first trench of the second region and the first trench of the first region adjacent to each other,
wherein the fourth trench has the first electrode formed therein via the first insulating film, and
wherein the first electrode in the first trench in the first region connected to the fourth trench is insulated from the source pad, is electrically connected to the first electrode in the first trench of the second region via the first electrode in the fourth trench, and is electrically connected to the second wiring located outside the source pad.

* * * * *